US008878489B2

(12) United States Patent
Chou et al.

(10) Patent No.: US 8,878,489 B2
(45) Date of Patent: Nov. 4, 2014

(54) ESTIMATION METHOD FOR RESIDUAL DISCHARGING TIME OF BATTERIES

(75) Inventors: Hung-Liang Chou, Kaohsiung (TW); Yu-Hua Sun, Kaohsiung (TW); Chin-Chang Wu, Kaohsiung (TW); Wen-Jung Chiang, Kaohsiung (TW)

(73) Assignee: Ablerex Electronics Co., Ltd., Taipei Hsien (TW)

( * ) Notice: Subject to any disclaimer, the term of this patent is extended or adjusted under 35 U.S.C. 154(b) by 802 days.

(21) Appl. No.: 12/948,934

(22) Filed: Nov. 18, 2010

(65) Prior Publication Data

US 2011/0260692 A1  Oct. 27, 2011

(30) Foreign Application Priority Data

Apr. 22, 2010 (TW) ............................... 99112650 A

(51) Int. Cl.
*H02J 7/00* (2006.01)
*H02J 7/04* (2006.01)
*G01R 31/36* (2006.01)

(52) U.S. Cl.
CPC .......... *G01R 31/3613* (2013.01); *H02J 7/0004* (2013.01); *H02J 7/008* (2013.01); *H02J 7/00* (2013.01); *G01R 31/3651* (2013.01)
USPC .......... 320/112; 320/127; 320/132; 320/128; 320/124

(58) Field of Classification Search
USPC ......... 320/132, 107, 112, 113, 127, 128, 133, 320/134, 136, 114, 115, 144, 145, 160, 124
See application file for complete search history.

(56) References Cited

U.S. PATENT DOCUMENTS

| 4,558,281 | A | * | 12/1985 | Codd et al. ................ 324/433 |
| 4,595,880 | A | * | 6/1986 | Patil ........................... 324/427 |
| 5,614,829 | A | * | 3/1997 | Song .......................... 324/427 |
| 5,761,072 | A | | 6/1998 | Bardsley, Jr. et al. |
| 5,808,445 | A | * | 9/1998 | Aylor et al. ................ 320/132 |
| 5,830,595 | A | * | 11/1998 | Song .............................. 429/92 |
| 6,137,292 | A | * | 10/2000 | Hirsch et al. .............. 324/427 |
| 6,300,763 | B1 | * | 10/2001 | Kwok ......................... 324/427 |
| 6,646,419 | B1 | * | 11/2003 | Ying ........................... 320/132 |
| 7,619,417 | B2 | * | 11/2009 | Klang ......................... 324/427 |

FOREIGN PATENT DOCUMENTS

TW  200905230  2/2009

* cited by examiner

*Primary Examiner* — Edward Tso
*Assistant Examiner* — Alexis A Boateng
(74) *Attorney, Agent, or Firm* — Alan Kamrath; Kamrath IP Lawfirm, P.A.

(57) ABSTRACT

An estimation method for residual discharging time of batteries includes the steps of: providing a set of battery-discharge-current intervals and a set of battery-discharge equations, setting the discharge time of each battery-discharge-current intervals at zero; detecting a discharge current, voltage and time of batteries; judging whether the discharge current exceeds all of the battery-discharge-current intervals; selecting one of the battery-discharge-current intervals and the associated battery-discharge equation according to the detected discharge current; calculating an estimation of residual discharging time; accumulating and recording the discharge time; judging whether the discharge voltage is lower than a predetermined value and calculating an estimation error of the residual discharging time; and adjusting parameters of the battery-discharge equation for reducing the estimation error of the residual discharging time if the estimation error is greater than a predetermined error value.

9 Claims, 1 Drawing Sheet

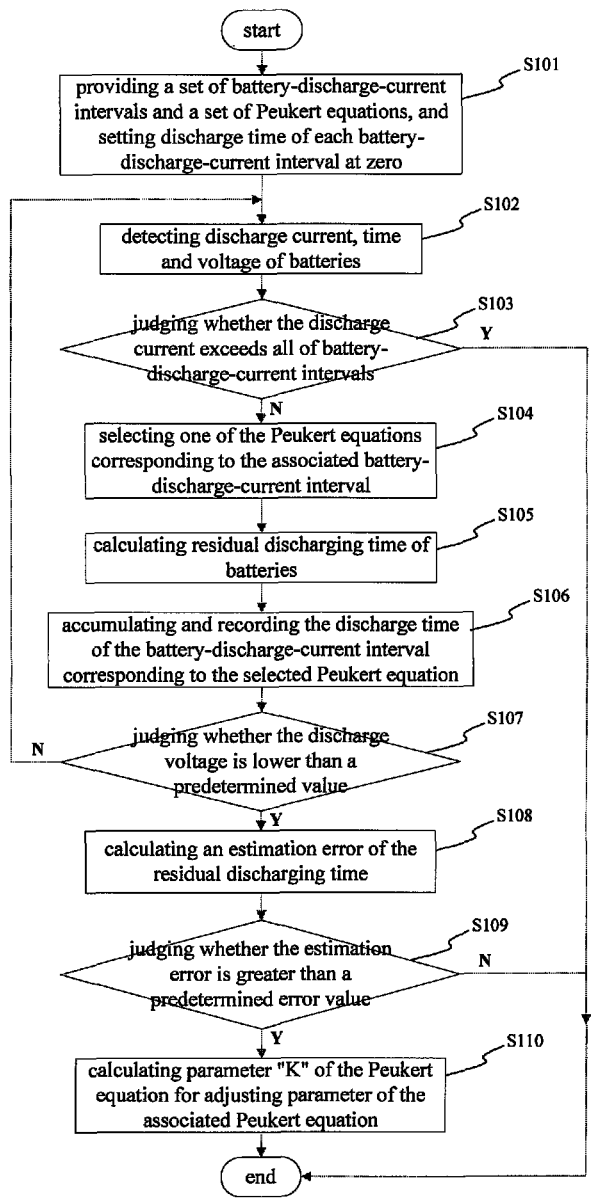

ESTIMATION METHOD FOR RESIDUAL DISCHARGING TIME OF BATTERIES

BACKGROUND OF THE INVENTION

1. Field of the Invention

The present invention relates to an estimation method for a residual discharging time of batteries (i.e. Li—Fe batteries). More particularly, the present invention relates to an estimation method for a residual discharging time of batteries utilizing multi-level Peukert equations. When a discharge current is detected, a residual discharging time is estimated by the Peukert equation of the discharge current interval corresponding to the detected discharge current, and discharge times are added up while discharging in a corresponding discharge current interval. If a discharge voltage is lower than a predetermined voltage, an estimation error of the residual discharging time is calculated. When the estimation error is greater than a predetermined value, parameters of the corresponding multi-level Peukert equation are adjusted.

2. Description of the Related Art

Recently, global warming has resulted in climate changes due to massive carbon dioxide release via the burning of fossil fuels. Thus, renewal energies (i.e. wind energy and solar energy) have been developed. In order to effectively manage and save electric power, high-capacity energy storage elements are provided. Currently, the widely-used high-capacity energy storage elements are lead-acid batteries. Even though the lead-acid batteries have advantages of low cost and high battery capacity, this type of battery cannot be charged by a high current for reducing the charging time. In addition, a high-current discharge will also reduce the battery capacity of the lead-acid batteries.

Li—Fe batteries provide a high-current charging/discharging operation which cannot be achieved by lead-acid batteries. Furthermore, a high-current discharge may not obviously affect the battery capacity of the Li—Fe batteries. The Li—Fe batteries further have advantages of high safety and stability in use. Accordingly, Li—Fe batteries are suitably used as high-capacity energy storage elements.

In order to improve the reliability and safety of battery and electric energy usage, there is a need for precisely estimating a residual discharging time of batteries. By way of example, U.S. Pat. No. 4,595,880, entitled "Battery State of Charge Gauge," discloses an ampere-hour method utilized to sense and sum up a real battery-discharging capacity for computing an average discharge current within a predetermined time unit. The used battery capacity is calculated from the average discharge current using the Peukert equation. Consequently, the discharge state of batteries, as well as the residual discharge capacity of batteries, is calculated from the used battery capacity using a function of the state of battery charge.

However, the above estimation method for a residual discharge capacity of batteries, disclosed in U.S. Pat. No. 4,595,880, requires computing an average discharge current within a predetermined time unit, and calculating the used battery capacity which is calculated from the average discharge current using the Peukert equation. However, the parameters of the Peukert equation must be obtained from experimental data, and cannot be precisely adjusted in response to conditions of battery's temperature change and battery aging, for example. However, once the changes of the battery's discharge current and temperature are large, the above estimation method cannot be operated to precisely adjust the parameters of the Peukert equation. Disadvantageously, this may result in a greater estimation error. Furthermore, the above estimation method fails to provide a function of estimating a residual discharging time of batteries.

U.S. Pat. No. 5,761,072, entitled "Battery State of Charge Sensing System," discloses two sets of average discharge currents are calculated from discharge currents of batteries using two predetermined functions. Two battery capacities and weighting constants thereof are calculated from the average discharge currents using the Peukert equation. Finally, the discharge state of batteries, as well as the residual discharge capacity of batteries, is calculated from the real battery capacities and weighting constants using a function of the discharge state of batteries.

However, the above estimation method for a residual discharge capacity of batteries, disclosed in U.S. Pat. No. 5,761,072, requires calculating two different average discharge currents from a battery's characteristic, and calculating battery capacities from the weighting constants. The discharge reaction of batteries is generally a chemical reaction. Therefore, the discharge current calculated from a single set of the battery's characteristic couldn't completely reflect the total effect of a real battery's characteristic. In fact, an operation manner, a discharge depth, an environmental temperature or other external factors may affect the discharge capacity of batteries. The above estimation method utilizes a single set of the Peukert equation to calculate the discharge capacity of batteries that may susceptibly result in an estimation error under different discharge currents. Furthermore, the above estimation method fails to automatically adjust the estimation error and to provide a function of estimating a residual discharging time of batteries.

Briefly, there is a need of improving the estimation method for a residual discharge capacity of batteries disclosed in U.S. Pat. No. 4,595,880 and U.S. Pat. No. 5,761,072 for reducing the estimation error. However, the estimation method using the Peukert equation also fails to provide a function of estimating a residual discharging time of batteries.

Taiwanese Patent Appl. Publication No. 200905230, entitled "Estimating Method for Battery Residue Capacity," discloses a method, including the steps of: providing a plurality of battery-discharge-current intervals and a plurality of Peukert equations, with each Peukert equation including parameters; detecting at least one discharge current of batteries; selecting the Peukert equation which corresponds to the associated battery-discharge-current interval; calculating an estimation value of battery capacity and a battery residue capacity; calculating a capacity correction factor for the designated battery-discharge-current interval if necessarily changing the battery-discharge-current interval; and recalculating the parameters of the Peukert equation if an error value between the estimation value and the real value of discharge capacity of batteries is greater than a predetermined value.

However, the above estimation method, disclosed in TWN Pub. No. 200905230, only provides a correction for the parameters of the Peukert equation in estimating the residue capacity of batteries, and fails to provide a correction for the parameters for estimating a residual discharging time of batteries. Hence, there is a need of providing a correction in estimating a residual discharging time of batteries.

As is described in greater detail below, the present invention provides an estimation method for a residual discharging time of batteries utilizing multi-level Peukert equations. When an estimation error of the residual discharging time is greater than a predetermined value, associated parameters of the multi-level Peukert equations are adjusted in such a way to mitigate and overcome the above problem.

SUMMARY OF THE INVENTION

The primary objective of this invention is to provide an estimation method for a residual discharging time of batteries. A plurality of battery-discharge-current intervals and multi-level Peukert equations thereof are preset, and the discharging time of each battery-discharge-current intervals is set zero. A discharge current, a discharge time and a discharge voltage of the batteries are detected for determining the corresponding battery-discharge-current interval and multi-level Peukert equation which is used to estimate and record a residual discharging time. If a discharge voltage is lower than a predetermined voltage, an estimation error of the residual discharging time is calculated. When the estimation error is greater than a predetermined value, parameters of the corresponding multi-level Peukert equation are adjusted. Accordingly, the estimation method is successful in reducing the estimation error of the residual discharging time.

The estimation method for the residual discharging time of batteries in accordance with an aspect of the present invention includes the steps of:

A. setting a plurality of battery-discharge-current intervals and Peukert equations (i.e. battery discharge equations) thereof, with each of the Peukert equations corresponding to the associated battery-discharge-current interval, and setting each discharge time of the battery-discharge-current interval zero;

B. detecting a discharge current, a discharge time and a discharge voltage of the battery;

C. judging whether the discharge current exceeds all of the battery-discharge-current intervals, and terminating the whole procedure if the discharge current exceeds the battery-discharge-current intervals;

D. selecting one of the Peukert equations corresponding to the associated battery-discharge-current interval according to the detected discharge current;

E. calculating the residual discharge time of the batteries;

F. accumulating and recording the discharge time of the battery-discharge-current interval corresponding to the selected Peukert equation;

G. judging whether the discharge voltage is lower than a predetermined value, and returning to step B if the discharge voltage is higher than the predetermined value;

H. calculating an estimation error of the residual discharging time if the discharge voltage is lower than a predetermined value;

I. judging whether the estimation error is greater than a predetermined error value, and terminating the whole procedure if the estimation error is lower than the predetermined error value; and J. adjusting parameters of the selected Peukert equation if the estimation error is greater than the predetermined error value.

Further scope of the applicability of the present invention will become apparent from the detailed description given hereinafter. However, it should be understood that the detailed description and specific examples, while indicating preferred embodiments of the invention, are given by way of illustration only, since various modifications will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a schematic block diagram of an estimation method for a residual discharging time of batteries in accordance with the preferred embodiment of the present invention.

DETAILED DESCRIPTION OF THE INVENTION

It is noted that an estimation method for a residual discharging time of batteries in accordance with the preferred embodiment of the present invention can be applicable to Li—Fe batteries or similar batteries having a high degree of usage safety and stability, but is not limitative of the present invention.

FIG. 1 is a schematic block diagram of an estimation method for a residual discharging time of batteries in accordance with the preferred embodiment of the present invention. Referring to FIG. 1, the estimation method in accordance with the preferred embodiment of the present invention includes the first step S101: providing a plurality of battery-discharge-current intervals and a plurality of Peukert equations (i.e. multi-level Peukert equations or battery-discharge equations) thereof. Each of the Peukert equations corresponds to one of the battery-discharge-current intervals which is arranged according to needs. Firstly, the discharging time of each battery-discharge-current interval is set zero. The Peukert equations are:

$$C_p = K/I^{n-1} \quad (1)$$

where I is a discharge current, K and n are parameters of Peukert equation, and $C_p$ is an estimation of residual discharge capacity of batteries.

The parameters of Peukert equations are calculated in the form of:

$$n = (\log t_2 - \log t_1)/(\log I_1 - \log I_2) \quad (2)$$

$$K = I_1 * t_1 * I_1^{n-1} = I_2 * t_2 * I_2^{n-1} \quad (3)$$

where I1 and I2 are minimum and maximum currents of the battery-discharge-current interval, and t1 and t2 are discharge times of minimum and maximum currents of the battery-discharge-current interval. These equations are not limitative of the present invention.

Each of the battery-discharge-current intervals has a set of the corresponding Peukert equations, and each of the Peukert equations has a set of different parameters.

Still referring to FIG. 1, the estimation method in accordance with the preferred embodiment of the present invention includes the second step S102: detecting a discharge current, a discharge time and a discharge voltage of batteries utilizing an external detector or other detectors.

Still referring to FIG. 1, the estimation method in accordance with the preferred embodiment of the present invention includes the third step S103: judging whether the discharge current exceeds all of the battery-discharge-current intervals. The following steps will be continuously executed if the discharge current does not exceed all of the battery-discharge-current intervals (identified as "N" in step S103). Conversely, the whole procedure will be terminated and calculations of the residual discharging time are no longer executed if the discharge current exceeds all of the battery-discharge-current intervals (identified as "Y" in step S103).

Still referring to FIG. 1, if the discharge current does not exceed all of the battery-discharge-current intervals (identified as "N" in step S103), the estimation method in accordance with the preferred embodiment of the present invention includes the fourth step S104: selecting one of the Peukert equations corresponding to the associated battery-dischargecurrent interval which are preset in the step S101, according to the detected discharge current.

Still referring to FIG. 1, the estimation method in accordance with the preferred embodiment of the present invention includes the fifth step S105: calculating the residual discharging time of the battery. The equation for calculating the initial residual discharging time is $$t_P = K/I^n \quad (4)$$

where $t_p$ is the initial residual discharging time of batteries, K and n are parameters of Peukert equation, and I is a discharge current.

The equation for calculating the residual discharging time is $$t_{rm} = t_p - t_{sm} \quad (5)$$

where $t_{rm}$ is a real-time residual discharging time of batteries, $t_p$ is the initial residual discharging time, and $t_{sm}$ is the accumulation of the discharging time.

Still referring to FIG. 1, the estimation method in accordance with the preferred embodiment of the present invention includes the sixth step S106: accumulating and recording the discharge time of the battery-discharge-current interval corresponding to the detected discharge current.

Still referring to FIG. 1, the estimation method in accordance with the preferred embodiment of the present invention includes the seventh step S107: judging whether the discharge voltage is lower than a predetermined value, continuing the following steps if the discharge voltage is lower than the predetermined value (identified as "Y" in step S107), and returning to the step S102 if the discharge voltage is higher than the predetermined value (identified as "N" in step S107).

Still referring to FIG. 1, if the discharge voltage is lower than the predetermined value (identified as "Y" in step S107), the estimation method in accordance with the preferred embodiment of the present invention includes the eighth step S108: calculating an estimation error of the residual discharging time when the discharge voltage is lower than a predetermined value. In this circumstance, the estimation error of the residual discharging time equals the estimated residual discharging time since the practical residual discharging time is set at zero when the discharge voltage is lower than a predetermined value.

Still referring to FIG. 1, the estimation method in accordance with the preferred embodiment of the present invention includes the ninth step S109: judging whether the estimation error is greater than a predetermined error value. The following step(s) will continue if the estimation error is greater than the predetermined error value (identified as "Y" in step S109). Conversely, the whole procedure of the present invention will be terminated if the estimation error is lower than the predetermined error value (identified as "N" in step S109).

Still referring to FIG. 1, if the estimation error is greater than the predetermined error value (identified as "Y" in step S109), the estimation method in accordance with the preferred embodiment of the present invention includes the tenth step S110: calculating a parameter "K" of the associated Peukert equation if the estimation error is greater than the predetermined error value. Finally, the whole procedure of the present invention will be terminated once the parameter "K" is obtained. The parameter "K" is in the form of $$K = (t_p * \text{Error}(\%) * \Phi + t_p) * I^n \quad (0 \le \Phi \le 1) \quad (6)$$

where Error(%) is an estimation error of the residual discharging time, the equation is written as Error(%)=(estimation error of the residual discharging time/real discharging time)*100%, K and n are parameters of Peukert equation, $t_p$ is the initial residual discharging time, I is a discharge current, and $\Phi$ is an adjustment ratio value. The adjustment ratio value is obtained from the product of the discharge time and a mean value of the discharge current within the associated battery-discharge-current interval corresponding to the associated Peukert equation, and the product is divided by the discharge capacity of batteries. The equation for the adjustment ratio value is $$\phi = \frac{t_x * \overline{I_x}}{AH}$$

where $t_x$ and $\overline{I_x}$ are the discharge time and a mean value of the discharge current within the associated battery-discharge-current interval corresponding to associated Peukert equation, the mean value of the discharge current is an average of a maximum and a minimum of the discharge current within the associated battery-discharge-current interval, AH is the discharge capacity, which is in the form of $$AH = \Sigma \overline{I_x} * t_x$$

It will be understood that the equation for calculating the parameter "K" of the Peukert equation applied in the present invention is not limitative of the present invention.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. An estimation method for a residual discharging time of batteries, comprising the steps of:
   A. setting a series of battery-discharge-current intervals for a discharge procedure from a discharge start step to a discharge terminating step and multiple separate battery-discharge equations thereof, with each of the multiple separate battery-discharge equations corresponding to at least one of the series of battery-discharge-current intervals, and further setting a discharge time of each of the series of battery-discharge-current intervals at zero;
   B. detecting a discharge current, a discharge time and a discharge voltage of the batteries;
   C. judging whether the discharge current exceeds all of the series of battery-discharge-current intervals, and terminating if the discharge current exceeds all of the series of battery-discharge-current intervals;
   D. selecting one of the multiple separate battery-discharge equations corresponding to the at least one of the series of battery-discharge-current intervals according to the detected discharge current;
   E. calculating a residual discharging time of the batteries;
   F. accumulating and recording the discharge time of the at least one of the series of battery-discharge-current intervals corresponding to the selected separate battery-discharge equation;
   G. judging whether the discharge voltage is lower than a predetermined value, and returning to the step B if the discharge voltage is higher than the predetermined value;
   H. calculating an estimation error of the residual discharging time when the discharge voltage is lower than the predetermined value;

I. judging whether the estimation error is greater than a predetermined error value, and terminating if the estimation error is lower than the predetermined error value; and J. adjusting parameters of the selected separate battery-discharge equation if the estimation error is greater than the predetermined error value.

2. The estimation method for the residual discharging time of the batteries as defined in claim 1, wherein the multiple separate battery-discharge equations are separate Peukert equations.

3. The estimation method for the residual discharging time of the batteries as defined in claim 2, wherein each separate Peukert equation for calculating an initial residual discharging time is $$t_p = K/I^n$$

where $t_p$ is the initial residual discharging time of the batteries, K and n are parameters of the separate Peukert equation, and I is the discharge current; and wherein an equation for calculating the residual discharging time is $$t_{rm} = t_p - t_{sm}$$

where $t_{rm}$ is a real-time discharge residual time of the batteries and $t_{sm}$ is an accumulation of the residual discharging time of the series of battery-discharge-current intervals.

4. The estimation method for the residual discharging time of the batteries as defined in claim 1, wherein, in the step H: calculating the estimation error of the residual discharging time when the discharge voltage is lower than the predetermined value of the discharge voltage, the estimation error of the residual discharging time equals the calculated residual discharging time.

5. The estimation method for the residual discharging time of the batteries as defined in claim 3, wherein, in the step J: adjusting the parameters of the selected separate battery-discharge equation if the estimation error is greater than the predetermined error value, the parameter "K" of the separate Peukert equation is calculated in the form of $$K = (t_p * \text{Error}(\%) * \Phi + t_p) * I^n \quad (0 \leq \Phi \leq 1)$$

where K and n are the parameters of the separate Peukert equation, $t_p$ is the initial residual discharging time, Error (%) is the estimation error of the residual discharging time, I is the discharge current, and $\Phi$ is an adjustment ratio value.

6. The estimation method for the residual discharging time of the batteries as defined in claim 5, wherein the adjustment ratio value $\Phi$ is a product of the discharge time and a mean value of the discharge current within the at least one of the series of battery-discharge-current intervals corresponding to the associated separate Peukert equation, and then the product is divided by the discharge capacity of the batteries, and wherein the mean value of the discharge current is an average of a maximum and a minimum of the discharge current within the at least one of the series of battery-discharge-current intervals corresponding to the selected separate Peukert equation.

7. The estimation method for the residual discharging time of the batteries as defined in claim 1, wherein each of the multiple separate battery-discharge equations has a set of different parameters.

8. The estimation method for the residual discharging time of the batteries as defined in claim 2, wherein each of the separate Peukert equations has a set of different parameters.

9. The estimation method for the residual discharging time of the batteries as defined in claim 1, wherein the series of battery-discharge-current intervals are battery-discharging time intervals suitable for different discharging procedures.

* * * * *